United States Patent
Hatefi et al.

(10) Patent No.: US 9,319,187 B2
(45) Date of Patent: Apr. 19, 2016

(54) METHOD AND A DEVICE FOR RELAYING IN A COMMUNICATIONS NETWORK

(75) Inventors: Atoosa Hatefi, Paris (FR); Raphaël Visoz, Vanves (FR); Antoine Berthet, Chatenay Malabry (FR)

(73) Assignee: France Telecom, Paris (FR)

( * ) Notice: Subject to any disclaimer, the term of this patent is extended or adjusted under 35 U.S.C. 154(b) by 221 days.

(21) Appl. No.: 13/817,767

(22) PCT Filed: Aug. 9, 2011

(86) PCT No.: PCT/FR2011/051893
§ 371 (c)(1),
(2), (4) Date: May 28, 2013

(87) PCT Pub. No.: WO2012/022905
PCT Pub. Date: Feb. 23, 2012

(65) Prior Publication Data
US 2013/0250776 A1    Sep. 26, 2013

(30) Foreign Application Priority Data
Aug. 19, 2010 (FR) ..................... 10 56671

(51) Int. Cl.
*H03M 13/09* (2006.01)
*H04B 7/155* (2006.01)
(Continued)

(52) U.S. Cl.
CPC ............ *H04L 1/244* (2013.01); *H04B 7/15521* (2013.01); *H04W 88/04* (2013.01); *H03M 13/093* (2013.01); *H04L 1/0061* (2013.01); *H04L 1/0083* (2013.01); *H04L 2001/0097* (2013.01)

(58) Field of Classification Search
CPC ..................... H04L 2001/0097; H04L 1/0061; H04L 1/08; H04L 1/1816; H04L 1/0083; H03M 13/00; H03M 13/093
USPC .......................................... 714/748, 749, 780
See application file for complete search history.

(56) References Cited

U.S. PATENT DOCUMENTS 5,142,539 A * 8/1992 Dahlin ................. H04L 1/0083
714/776
5,428,629 A * 6/1995 Gutman ................ H04L 1/0083
714/758
(Continued)

FOREIGN PATENT DOCUMENTS

EP    1729435 A1    12/2006

OTHER PUBLICATIONS

Dereje H. Woldegebreal et al: "Multiple-Access Relay Channel with Network Coding and Non-Ideal Source-Relay Channels", Wireless Communications Systems, 2007. ISWCS 2007. 4th International Symposium on, IEEE, Piscataway, NJ, USA, Oct. 1, 2007, pp. 732-736, XP031166866.

(Continued)

*Primary Examiner* — James C Kerveros
(74) *Attorney, Agent, or Firm* — David D. Brush; Westman Champlin & Koehler, P.A.

(57) ABSTRACT

A method and device for selective relaying in a communications network having a plurality of sources, a relay, and a reception device. The method includes the following steps: the relay receives messages transmitted respectively by the sources in order to obtain an estimate of the messages; the relay detects errors in the estimated messages; the relay transmits a representative signal to the reception device, the signal being representative of only those messages for which no error was detected and resulting from a non-bijective surjective function applied to the messages detected without error, the function including interleaving and encoding; and the representative signal being transmitted by the relay to the reception device with a control signal indicating which messages are represented in the representative signal.

9 Claims, 13 Drawing Sheets

(51) Int. Cl.
*H04L 1/00* (2006.01)
*H04L 1/24* (2006.01)
*H04W 88/04* (2009.01)

(56) References Cited

U.S. PATENT DOCUMENTS

| | | | | |
|---|---|---|---|---|
| 5,612,992 | A * | 3/1997 | Dupuy et al. | 455/466 |
| 5,689,518 | A * | 11/1997 | Galand | H03M 13/093 |
| | | | | 714/752 |
| 5,898,679 | A * | 4/1999 | Brederveld et al. | 370/315 |
| 5,982,760 | A * | 11/1999 | Chen | 370/335 |
| 6,275,966 | B1 * | 8/2001 | Sitterley | 714/782 |
| 8,356,241 | B2 * | 1/2013 | Isoyama | 714/807 |
| 8,381,056 | B2 * | 2/2013 | Taori et al. | 714/748 |
| 8,611,229 | B2 * | 12/2013 | Wu et al. | 370/242 |
| 8,693,583 | B2 * | 4/2014 | Das et al. | 375/340 |
| 8,700,979 | B2 * | 4/2014 | Arai et al. | 714/794 |
| 2006/0291440 | A1 | 12/2006 | Hausl et al. | |
| 2007/0076740 | A1 * | 4/2007 | Manjeshwar | 370/432 |
| 2009/0310536 | A1 * | 12/2009 | Tsai | H04L 1/0003 |
| | | | | 370/328 |
| 2010/0182916 | A1 | 7/2010 | Drewes et al. | |

OTHER PUBLICATIONS

Del Ser, J. et al: "On Combining Distributed Joint Source-Channel-Network Coding and Turbo Equalization in Multiple Access Relay Networks", Wireless and Mobile Computing, Networking and Communications, 2007. WIMOB 2007. Third IEEE International Conference on, IEEE, Piscataway, NJ, USA, Oct. 8, 2007, p. 18, XP031338301.

International Search Report and Written Opinion of the International Searching Authority dated Nov. 2, 2011 for corresponding International Patent Application No. PCT/FR2011/051893, filed Aug. 9, 2011.

French Search Report and Written Opinion dated Mar. 7, 2011 for corresponding French Patent Application No. 1056671, filed Aug. 19, 2010.

\* cited by examiner

METHOD AND A DEVICE FOR RELAYING IN A COMMUNICATIONS NETWORK

CROSS-REFERENCE TO RELATED APPLICATIONS

This Application is a Section 371 National Stage Application of International Application No. PCT/FR2011/051893, filed Aug. 9, 2011, which is incorporated by reference in its entirety and published as WO 2012/022905 on Feb. 23, 2012, not in English.

STATEMENT REGARDING FEDERALLY SPONSORED RESEARCH OR DEVELOPMENT

None.

THE NAMES OF PARTIES TO A JOINT RESEARCH AGREEMENT

None.

FIELD OF THE DISCLOSURE

The present disclosure relates to a method and to a device for relaying in a communications network.

In general manner, the present disclosure relates to the field of digital communications.

The present disclosure relates more particularly to the problem of network coding, with networks having relays forming a part of that problem. The present disclosure applies to a multi-user network made up of a plurality of sources, a relay, and a destination (using the multiple-access relay channel (MARC) model). In this type of network topology, the sources broadcast their coded information sequences for the attention of the relay R and of the destination D. The relay has to decode the signals received from the sources and re-encode them (jointly) while adding its own redundancy suitable for creating a spatially-distributed network code. At the destination, the decoding of the spatially-distributed coded sequences, comprising the coded sequences received from the sources and the coded sequence sent by the relay, relies on joint channel/network decoding algorithms. One of the problems that arises is that the connections from source nodes to the relay node R do not always enable the received signal to be decoded without error at the node R. The final destination must be capable of restoring the reliability of the received signals including the quality of the radio links passed through. Furthermore, in order to reach full diversity, it is necessary to be able to recover all of the messages in the event of an interruption of a link. The present disclosure applies to so-called half-duplex (HD) and full duplex (FD) relays, and also to orthogonal links (without interference) and to non-orthogonal links.

BACKGROUND OF THE DISCLOSURE

The concept of co-operation between the nodes of a wireless network has become increasingly successful over the last few years. It has been shown that certain practical embodiments of this concept make it possible to increase both the spectral efficiencies and the reliability of transmission for wireless communications systems.

Network coding is an advanced form of co-operation in which the nodes of the network share not only their own resources (power, bandwidth, etc.) but also their computation capacities, thereby creating a kind of distributed coding that becomes increasingly powerful as the information propagates through the nodes. This coding leads to substantial gains in terms of diversity and of coding.

In the realistic circumstance of a relay channel having Rayleigh fading with the source having no knowledge of the S→R channel, there exists non-zero probability that the relay will decode the message from the source imperfectly. This can lead to errors being propagated to the destination.

In the prior art, the scientific publication "Joint channel and network decoding for XOR-based relay in multi-access channel" by S. Tang, J. Cheng, C. Sun, R. Miura, S. Obana, published in IEICE Transactions on Communication, Vol. E92-B, No. 11, November 2009, there is disclosed a joint channel/network code for a two-source MARC network that can achieve full diversity, and that takes into consideration the non-reliability of the source-to-relay links by applying the "joint selective" function for relaying. To do this, the relay transmits a network coded version of the messages received if both messages received from the sources are decoded without error. The technique described in that prior art scientific publication includes at least the following two drawbacks:

the relaying function relies on the "joint selective" approach: the relay transmits nothing if one of the two source messages is detected as being erroneous at the relay; and the "code design" is limited to circumstances in which the sources and the relay use the same coding schemes.

The scientific publication "Multiple-access relay channel with network coding and non-ideal source-relay channels" by Dereje H. Woldegebreal et al., published in ISWCS 2007, 4th International Symposium on Wireless Communication Systems, 2007, IEEE, Piscataway, N.J., USA, Oct. 1, 2007 pp. 732-736, XP031166866 describes a MARC system in theoretical manner that relies on the assumption that the channel decoding of the signals coming from the sources and the relays is performed separately from the XOR decoding at the destination.

In an "adaptive" mode, the relay transmits network coding only if both of the messages it receives from the sources have been decoded correctly. If this does not happen (an error is detected), either the relay transmits the message that was decoded without error, if there is one, or else the relay remains silent. Error detection may be based on a cyclic redundancy check (CRC) and the relay may then add the transmission of "extra-bits" to indicate the result of the decoding. The publication is concerned essentially with calculating the theoretical performance limits of the MARC system without describing a method of implementing it.

SUMMARY

An exemplary embodiment of the present invention provides a method of selective relaying in a communications network having a plurality of sources, a relay, and a destination, comprising the following steps:

the relay receiving messages transmitted respectively by the sources in order to obtain an estimate of the messages;

the relay detecting errors in the estimated messages;

the relay transmitting a representative signal to the destination, the signal being representative of only those messages for which no error was detected and resulting from a non-bijective surjective function applied to the messages detected without error, comprising interleaving and encoding; and the representative signal being transmitted by the relay to the destination with a control signal indicating the at least one message represented in the representative signal, i.e. participating in said signal.

It is necessary to interleave the messages detected without error in order to perform joint channel decoding of the sources and of the relay signal at the destination.

Thus, the method of an embodiment of the invention makes it possible to limit the propagation of error from the relay to the destination when the source-to-relay links are not very reliable.

In the particular case of two sources, the representative signal indicates for each message detected without error that the message comes from a respective one of the sources only or that two messages without error come from both sources. Consequently, the relay does not transmit any signal solely in the case when the messages from both sources are detected as having errors. In other circumstances, the relay transmits a message that is representative either of a message coming from one of the two sources (when the other message is detected with error), or of both messages each coming from respective ones of the sources (when both messages are detected without error). When there are more than two sources, the above principle applies in similar manner, with the two sources being replaced by n sources, n being the number of sources, it being understood that the transmitted signal is representative of at most n messages, but that it could equally well represent only one of them.

In an implementation, in the event of at least two messages being detected without error, the representative signal results from a network and channel coding function that depends on the number of messages detected without error and that is applied to those messages for which no error was detected. With such coding, the signal transmitted by the relay does not enable the destination to detect the messages transmitted by the sources; the destination must implement joint detection making use simultaneously of the representative signal sent by the relay and the signals received by the destination and coming directly from the sources. Given that a message detected erroneously by the relay does not participate in the content of the representative signal, this advantageously makes it possible to improve the joint detection method by providing a signal that is representative solely of the at least one signal that has been received by the relay without error.

When no message is received by the relay without error, then the relay does not transmit any representative signal.

In an implementation, the error detection step is performed by means of a CRC type code. This makes it possible to optimize error detection.

In a particular implementation, the network and channel coding function includes a step of modulo-2 (exclusive OR (XOR)) addition of only those messages for which no error was detected. This makes it possible to recover a message if all of the others are known. Having knowledge of the modulo-2 sum and of the other messages, it is possible to recover one message. The control signal may be used in this context in order to determine the source from which the message recovered in this way originates.

In an implementation, the modulo-2 (exclusive OR) addition of the messages is performed together with their respective CRC codes. This makes it possible at the destination to test the presence of errors in the messages decoded from the received signal coming from the relay and from a priori information coming from the decoding/detection of signals received at the destination and coming directly from the sources. This results in simplification of reception at the destination.

In an embodiment, channel coding is applied by the relay to the messages for which no error is detected. Although the modulo-2 (exclusive OR) sum makes it possible to provide the system with full diversity (i.e. makes it possible to recover all of the messages in the event of a single link being interrupted—with knowledge of the modulo-2 sum and of the other messages it is possible to recover one message), this channel coding makes it possible to achieve better performance for the binary error rate per source (or error rate per message for each source at the destination) at the cost of additional redundancy introduced by the coding on the signal that results from the XOR at the relay. The way in which the data from the sources is combined at the relay in this implementation makes it possible to obtain full diversity at the destination, while minimizing the propagation of errors to the destination.

An embodiment of the present invention also provides a selective relaying device for a communications network having a plurality of sources, and a destination, the relay being characterized in that it comprises means for:

receiving messages transmitted respectively by the sources to obtain estimates of the messages;

detecting errors in the estimated messages;

sending a representative signal to the destination, the signal being representative of only those messages for which no error was detected and resulting from a non-bijective surjective function applied to the messages detected without error and comprising interleaving and encoding; and the representative signal being transmitted by said relay device to the destination with a control signal indicating the at least one message represented in the representative signal.

An embodiment of the present invention also provides a computer program including code instructions for implementing steps of the selective relaying method when the instructions are executed by a processor.

An embodiment of the present invention also provides a recording medium for a computer program including code instructions for implementing steps of the selective relaying method when the instructions are executed by a processor.

An embodiment of the present invention also provides a method of receiving messages, the message-reception method being implemented in a destination of a MARC system having a plurality of sources and a relay for implementing a relaying method of an embodiment of the invention, the message-reception method being characterized in that it includes the following step:

iterative detection/decoding applied jointly to received messages coming from the sources and to a received signal coming from the relay and representative of messages coming from the sources and received without error by the relay, under control of a control signal transmitted by the relay indicating the at least one message represented in the representative signal.

In an implementation, the representative signal comes from modulo-2 summing of the messages indicated by said control signal as being represented in said transmitted representative signal.

As mentioned above, this sum makes it possible to recover a message providing all of the other messages are known. Knowledge of the modulo-2 sum and of the other messages makes it possible to recover one message and thus to recover all of the messages in the presence of only one link being interrupted.

In an implementation, the detection/decoding step is iterative. An iterative method is the most effective (in terms of performance and complexity) for practically performing joint detection at the destination, while making use of the signals received and transmitted from the sources together with the representative signal received and transmitted from the relay.

An embodiment of the present invention also provides a message-reception device for a communications network having a plurality of sources and a relay, the device being characterized in that it includes means for:

jointly detecting/decoding received messages coming from the sources and a received signal coming from the relay and representative of messages received without error by the relay, in iterative manner and under control of a control signal transmitted by the relay indicating the at least one message represented in the representative signal.

An embodiment of the present invention also provides a computer program including code instructions for implementing steps of the reception method when the instructions are executed by a processor.

An embodiment of the present invention also provides a recording medium for a computer program including code instructions for implementing steps of the reception method when the instructions are executed by a processor.

The optional characteristics described above in the context of the relaying method may be applied to the relaying device, to the program, and to the recording medium as mentioned above.

An embodiment of the present invention also provides a communications system including at least one relaying device and at least one reception device as specified above.

BRIEF DESCRIPTION OF THE DRAWINGS

Embodiments of the invention can be better understood with the help of the following description given purely for explanatory purposes of an implementation of the invention and with reference to the accompanying figures, in which.

The following assumptions are made below concerning the MARC network:

the sources, the relay, and the destination are perfectly synchronized; and the sources are independent (there is no correlation between them).

DETAILED DESCRIPTION OF ILLUSTRATIVE EMBODIMENTS

Figure 1:
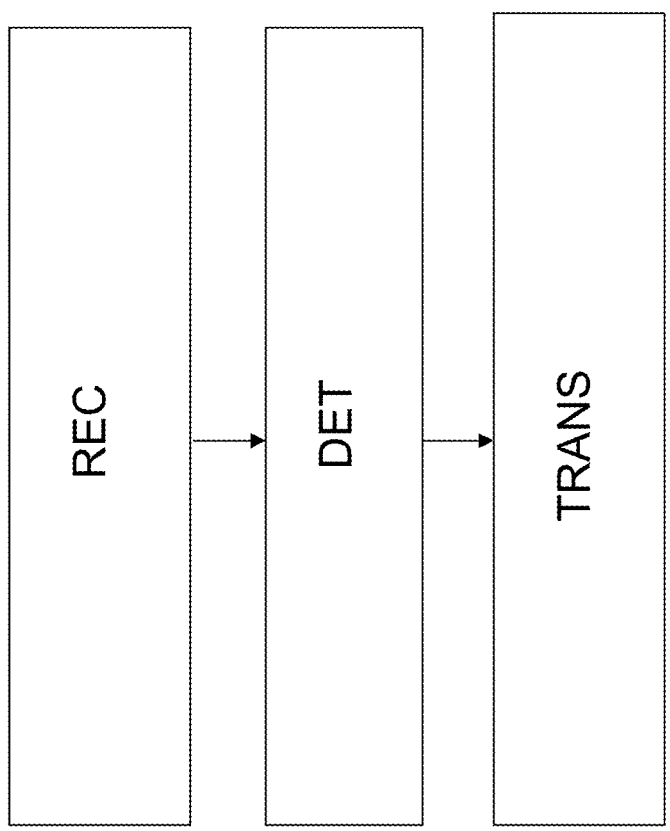
FIG. 1 shows an implementation of the method of an embodiment of the present invention.

FIG. 1 shows the method of an embodiment of the present invention in one implementation. The method comprises a reception step (written REC in FIG. 1) in which the relay R receives messages $u_1, u_2, \ldots, u_N$ each associated with a respective source, a detection step (written DET in FIG. 1), in which the relay R detects errors in the messages; and a transmission step (written TRANS in FIG. 1) in which the relay (R) transmits a signal to the destination (D), which signal is representative of only those messages for which no error is detected. The representative signal is transmitted by the relay R to the destination D together with a control signal indicating which messages are represented in the representative signal.

Figure 2:
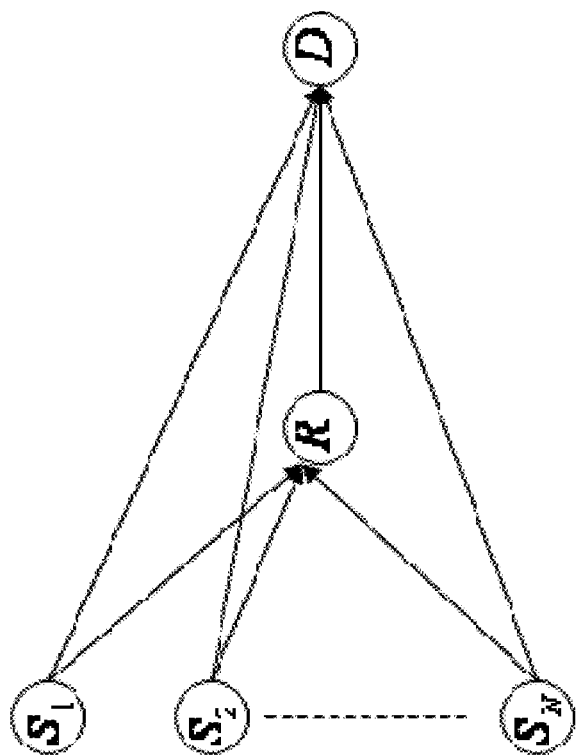
FIG. 2 shows a MARC type channel.

FIG. 2 is an abstract model of communication between N nodes $S_1, S_2, \ldots, S_N$ and the destination D with the help of a relay channel R. The communications system of an embodiment of the invention comprises at least the relay R and the destination D. By way of illustration, in the description below consideration is given to a MARC network with a so-called "half-duplex" relay (i.e. the relay is not capable of receiving and transmitting simultaneously), and with links that are orthogonal in time. Thus, N+1 transmission stages are distinguished. The sources $S_1, \ldots, S_N$ broadcast their data to the relay and to the destination during the N first transmission stages. The relay is silent and performs joint decoding/re-encoding in order to deduce the signal that is to be sent during the next stage. Channel codes are used by the sources and network code is used in the relay in order to combine intelligently the messages detected from the N sources. Below, a new joint channel/network coding/decoding method is proposed for this model.

By way of example, each of the sources is a mobile terminal in a communications network. By way of example, the relay may be a "lightweight" base station or a terminal, and the destination may for example be a base station.

In a variant, each of the sources may for example be a base station. The relay may for example be a "lightweight" base station or a terminal, and the destination may be a terminal, for example.

In these various configurations, the destination may be a concentrator node in the sense that it receives messages from all of the sources, and it may be suitable for decoding all of the messages received in joint manner.

Figure 3:
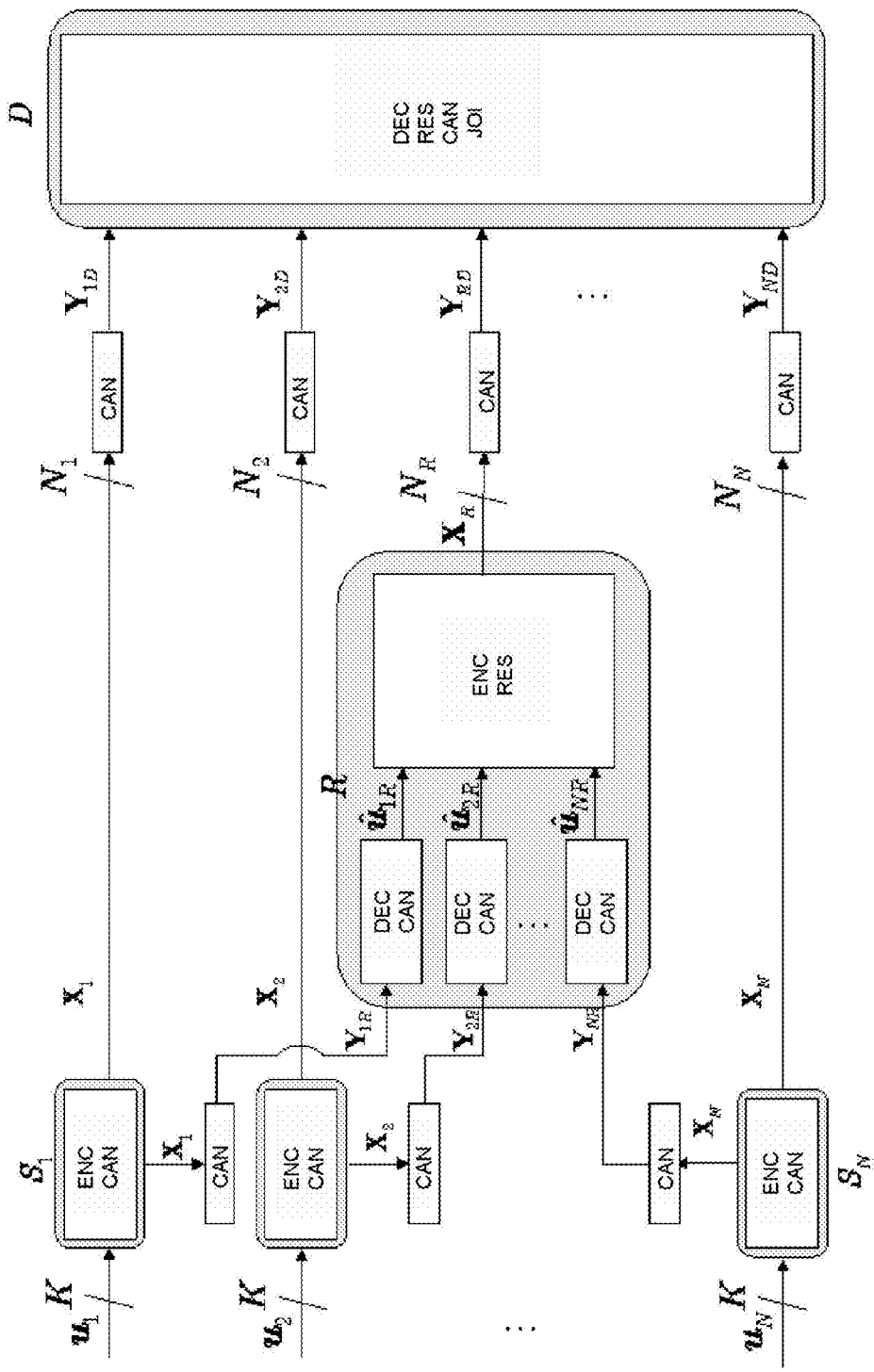
FIG. 3 shows a scheme for co-operation in a multi-user MARC network with links.

The model for the system is shown in FIG. 3.

The sources $S_1, \ldots, S_N$ seek to transmit their data segmented into blocks $u_1, \ldots, u_N$ to the destination. In one implement, each message block contains its own cyclic redundancy check (CRC). The blocks $u_i \in F_2^K$, $i \in \{1, \ldots, N\}$ are of lengths K, and it is assumed that the sources are statistically independent ($F_2$ being the two-element Galois field). Each source $S_i$ has $T_i$ antennas and uses a space-time modulation and coding scheme $\Theta_i$ that associates each message vector $u_i$ with coded and modulated signals $X_i \in \chi_i^{T_i \times N_i}$ belonging to complex constellations $\chi_i$ of cardinalities $|\chi_i| = 2^{q_i}$ ($q_i \in N$):

$$\Theta_i : F_2^K \to \chi_i^{T_i \times N_i}$$

$X_i$ are referred to below as code words transmitted by the sources $S_i$. It is assumed that the N sources $S_i$ transmit their code words $X_i \in \chi_i^{T_i \times N_i}$ in N orthogonal transmission stages, each during $N_i$ channel utilizations.

The relay having $R_x$ receive antennas and $T_R$ transmit antennas receives during the N first stages the disturbed versions of the symbols $y_{iR,k} \in C^{R_x}$:

$$y_{iR,k} = \sum_{m=0}^{M} H_{iR,k,m} x_{i,k-m} + n_{iR,k}$$

$$k = 1, \ldots, N_i,$$

$$i \in \{1, \ldots, N\}$$

where $n_{iR,k} \in \mathbb{C}^{R_x}$ designates the additive noise vector, $H_{iR} \in \mathbb{C}^{R_x \times T_i}$ designates the matrix of fading coefficients between the N sources and the relay, and M designates the channel memory (the memory effect of the channel is associated with the propagation delay or "delay spread"). This delay causes transmitted signals to be superposed, which gives rise to interference between symbols. There is no constraint on the transmission channel. It may have fading that is "fast" or "slow", it may be frequency selective, it may have multiple inputs and multiple outputs (MIMO).

Figure 4A:
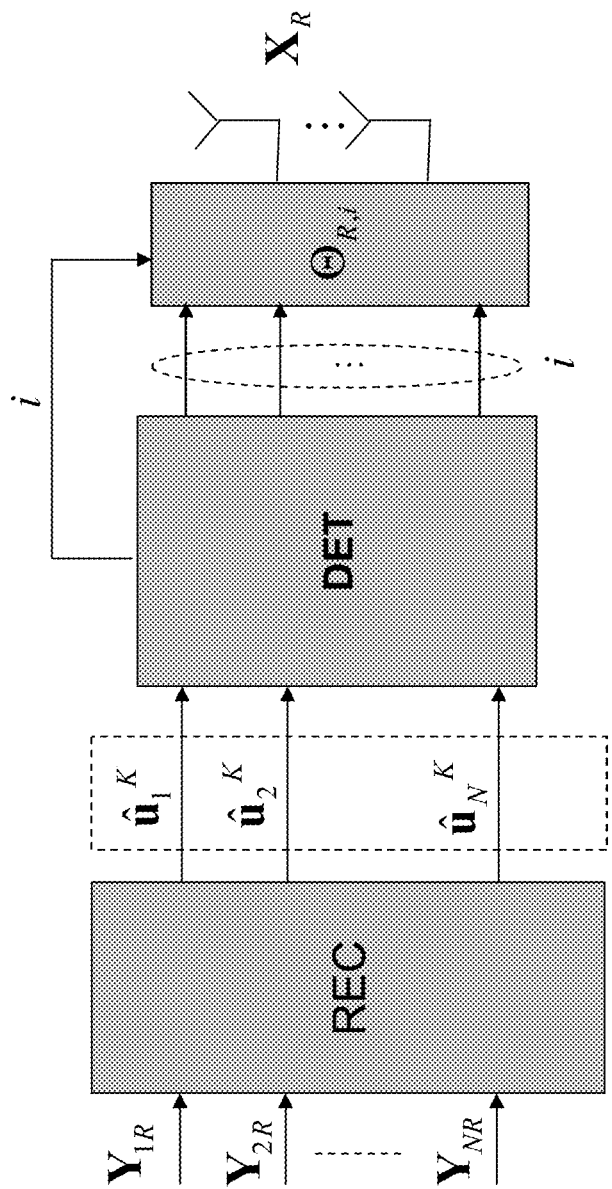
FIG. 4a shows the processing of the relay in the general case with non-erroneous messages being selected.

The relay performs detection/decoding to obtain the estimated bit vectors from each source $\hat{u}_i \in F_2^K$. Thereafter it performs error detection (FIG. 4a) (e.g. using the CRC). The reception module referenced REC in FIG. 4a receives $Y_{1R}$, $Y_{2R}$, ..., $Y_{NR}$ and transmits $\hat{u}_1, \hat{u}_2, \ldots, \hat{u}_N$ to the error detection and selection module (referenced DET in FIG. 4a) where $Y_{iR}$ is the set of disturbed versions of the symbols received from the source i.

It is assumed below that error detection is perfect. Let J be the set of indices for messages detected without error $J=\{j_1, j_2, \ldots, j_{|J|}\}$. The relay has available a series of functions $\{\Theta_{R,i}, i=1, \ldots, N\}$. Depending on the number of messages detected without error, the relay applies a function $\Theta_{R,|J|}$ that associates the signal $X_R \in \mathbb{C}^{T_R \times N_R}$ for $J \neq \emptyset$ with the set $\{u_{j_1}, u_{j_2}, \ldots, u_{j_{|J|}}\}$ as follows:

$$\Theta_{R,|J|} : \underbrace{F_2^K \times F_2^K \times \ldots \times F_2^K}_{|J| \text{ times}} \to \mathbb{C}^{T_R \times N_R}$$

and $X_R = 0_{T_R \times N_R}$ for $J \neq \emptyset$ (no transmission from the relay).

In general, the function $\Theta_{R,|J|}$ is a surjection, but is not a bijection on the messages detected without error $\{u_{j_1}, u_{j_2}, \ldots, u_{j_{|J|}}\}$, this function is referred to as the network and channel coding function for $|J|>1$. Consequently, the messages from the sources $\{u_{j_1}, u_{j_2}, \ldots, u_{j_{|J|}}\}$ cannot be detected at the destination from the signal transmitted by the relay alone but must be subjected to a joint detection method at the destination (D) based both on the signals transmitted by the sources $(S_{j_1}, S_{j_2}, \ldots, S_{j_{|J|}})$ corresponding to the messages $\{u_{j_1}, u_{j_2}, \ldots, u_{j_{|J|}}\}$, and the signal transmitted by the relay.

In an implementation, in a configuration having two sources and only one transmit antenna at the relay, the function $\Theta_{R,1}$ is the result, for example, of concatenating an interleaver, a systematic recursive convolution code of rate 1/2 (accepting one input), a selection of K parity bits, a channel interleaver, and modulation.

The function $\Theta_{R,2}$ is the result of concatenating an identical interleaver on two messages detected without error, a systematic recursive convolution code of rate 2/3 accepting two inputs that are the interleaved messages, a selection of K parity bits, a channel interleaver, and modulation.

In an implementation, the function $\Theta_{R,i}$ is made up of two steps:
  in a first step, the relay adds all of the messages detected without error using an exclusive OR (XOR) operation to obtain the K bit message $$u_R = \bigoplus_{j \in J} u_j = u_{j_1} \oplus u_{j_2} \oplus \ldots \oplus u_{j_{|J|}}$$

Figure 4B:
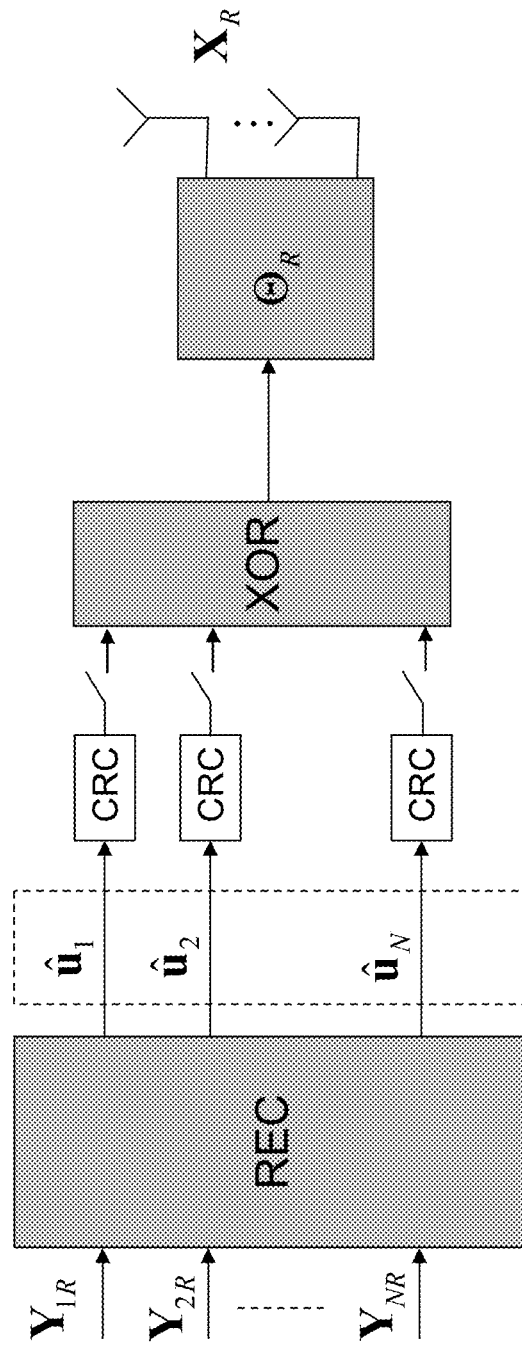
FIG. 4b shows the processing of the relay particularized for XOR and space-time coding/modulation.

(the exclusive OR addition of the messages is performed bit by bit). The function that is applied thus differs as a function of the number of error-free messages; and
  in a second step, the relay applies a function $\Theta_R$ to the message $u_R$ so as to obtain the signal:

$$X_R = \begin{cases} 0_{T_R \times N_R} & \text{for } J = \emptyset \\ \Theta_R(u_R) \in \mathbb{C}^{T_R \times N_R} & \text{for } J \neq \emptyset \end{cases}$$

that is to be sent to the destination by the relay on $N_R$ uses of the channel and during the transmission stage N+1 (FIG. 4b). The function $\Theta_R$ is a space-time modulation and coding scheme that associates each vector $u_R$ with coded and modulated symbols $X_R \in \chi_R^{T_R \times N_R}$ belonging to the complex constellation $\chi_R$ of cardinality $|\chi_R|=2^{q_R}$ ($q_R \in \mathbb{N}$):

$$\Theta_R : F_2^K \to \chi_2^{T_R \times N_R}$$

When it is not the empty set, the set J is signaled by the relay to the destination. A control signal (here an "in-band" signal transmitted together with the messages) specifying the messages that participated in the network and channel coding is thus sent by the relay to the destination.

Finally, the destination observes the sent signals coming from the N sources and from the relay during the N+1 transmission stages. The destination attempts to recover the messages $u_1, \ldots, u_N$.

Figure 4C:
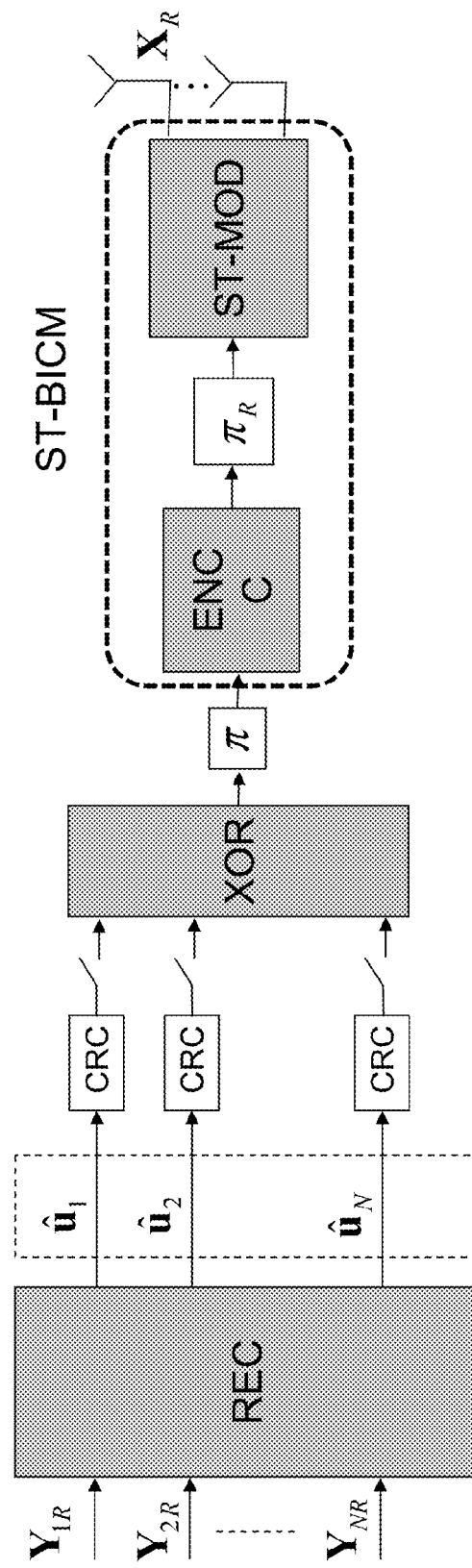
FIG. 4c shows the processing of the relay particularized for XOR and ST-BICM.

FIG. 4c shows the processing scheme at the relay particularized for XOR network coding and space-time bit interleaved coded modulation (ST-BICM) channel coding. The proposed scheme may be considered as being the so-called "selective XOR" protocol.

The relay decodes the data from the N sources in hard manner. It rejects erroneous blocks in order to avoid error propagation and it combines all of the non-erroneous blocks with an XOR, i.e.

$$u_R = \bigoplus_{j \in J} u_j = u_{j_1} \oplus u_{j_2} \oplus \ldots \oplus u_{j_{|J|}}$$

where J is the set of indices for the messages decoded without error (or at least assumed to be error-free as a result of the CRC verification $J=\{j_1, j_2, \ldots, j_{|J|}\}$ of cardinality $|J|$ (i.e. the number of elements in the set J is equal to $|J|$) and $\oplus$ represents bitwise modulo-2 addition of two messages. In equivalent manner, the XOR operation may be written in matrix form as follows:

$$u_R = [I_1 I_2 \ldots I_{|J|}] \begin{bmatrix} u_{j_1} \\ u_{j_2} \\ \ldots \\ u_{j_{|J|}} \end{bmatrix}$$

where $I_j$ is the identity matrix of dimension K×K.

Consequently, the XOR operation on the messages decoded without error is a linear function relative to $u_c = [u_{j_1}^T u_{j_2}^T \ldots u_{j_{|J|}}^T]^T \in F_2^{K|J|}$ resulting from concatenation of the messages in a vector of dimension K|J|.

Furthermore, its specific property is that each message results from modulo-2 addition with the remainder of the messages in order to give $u_R$, and can thus be found from $u_R$ if all of the other messages are known. The messages that have been summed are indicated to the destination by in-band signaling (by transmission of the control signal) from the relay, as described above.

The messages $u_j$ involved in $u_R$ preferably contain respective CRCs, i.e. the XOR function is applied to the messages together with their CRCs.

The combined bits are interleaved by an interleaver $\pi$ and they are processed using the coding and modulation scheme of the relay that is based on a binary and linear coding function $C: F_2^K \rightarrow F_2^{n_R}$, a binary interleaver $\pi_R$, and a symbol bit coding function (modulation) $\phi_R: F_2^{q_R T} \rightarrow \chi_R^T$, where $\chi_R$ is the constellation of symbols obtained of cardinality $|\chi_R|=2^{q_R}$, $q_R$ being a natural integer.

Let $\Pi$ be the interleaving matrix of dimension K×K corresponding to $\pi$, $G_C$ the matrix generating the code C of dimension $n_R \times K$ (and of rate $$\frac{K}{n_R}),$$

and let $C_{R,k}$, $k=1, \ldots, n_R$ be the code bits at the output from the coder C. This gives:

$$c_R = G_C \Pi [I_1 I_2 \ldots I_{|J|}] \begin{bmatrix} u_{j_1} \\ u_{j_2} \\ \ldots \\ u_{j_{|J|}} \end{bmatrix}$$

all of the operations being performed on $F_2$.

The symbols that are produced $X_R \in \chi_R^{T_R \times N_R}$ are then sent to the destination during $N_R$ utilizations of the channel. It should be observed that $X_R$ makes it possible to get back to $u_R$, and is thus indeed a code word.

Figure 4D:
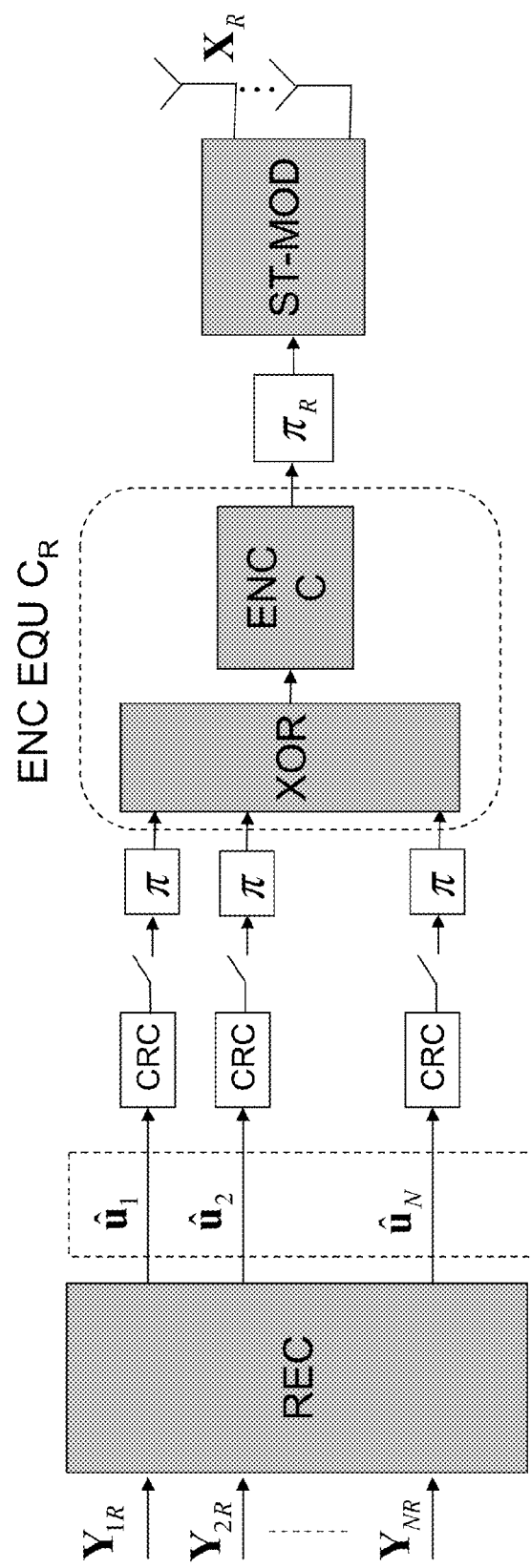
FIG. 4d shows an equivalent model of the processing of the relay for the XOR and ST-BICM case.

As is obvious, the matrices $\Pi$ and $I_j$ are commutative, so changing the sequencing of the XOR and of the interleaver $\pi$ gives an equivalent model shown in FIGS. 4c and 4d and represented by:

$$c_R = G_c [I_1 I_2 \ldots I_{|J|}] \begin{bmatrix} \Pi & 0 & \ldots & 0 \\ 0 & \Pi & \ldots & 0 \\ \ldots & \ldots & \ldots & \ldots \\ 0 & \ldots & \ldots & \Pi \end{bmatrix} \begin{bmatrix} u_{j_1} \\ u_{j_2} \\ \ldots \\ u_{j_{|J|}} \end{bmatrix}$$

$$= G_{C_R} = \begin{bmatrix} \Pi & 0 & \ldots & 0 \\ 0 & \Pi & \ldots & 0 \\ \ldots & \ldots & \ldots & \ldots \\ 0 & \ldots & \ldots & \Pi \end{bmatrix} \begin{bmatrix} u_{j_1} \\ u_{j_2} \\ \ldots \\ u_{j_{|J|}} \end{bmatrix}$$

$$= G_{C_R} u'_c$$

Below, $C_R$ is used to write the encoder equivalent to the relay that is constituted by XOR followed by the encoder C, and $G_{C_R}$ is used to write the matrix that generates the equivalent encoder $C_R$. This matrix represents a linear code on the interleaved and concatenated messages $u'_c$ that conventionally accept Soft-In-Soft-Out (SISO) decoding.

Below, consideration is given to a MARC network having two sources (N=2) and it is assumed that the sources, the relay, and the destination are each fitted with a respective single antenna for transmission and/or reception, i.e. $T_1=T_2=T_R=R_x=1$. Furthermore, the modulation coding schemes at the two sources and at the relay are based on bit interleaved coded modulation (BICM). BICM is a series concatenation of a binary encoder, a binary interleaver, and a modulator of any order.

Figure 4E:
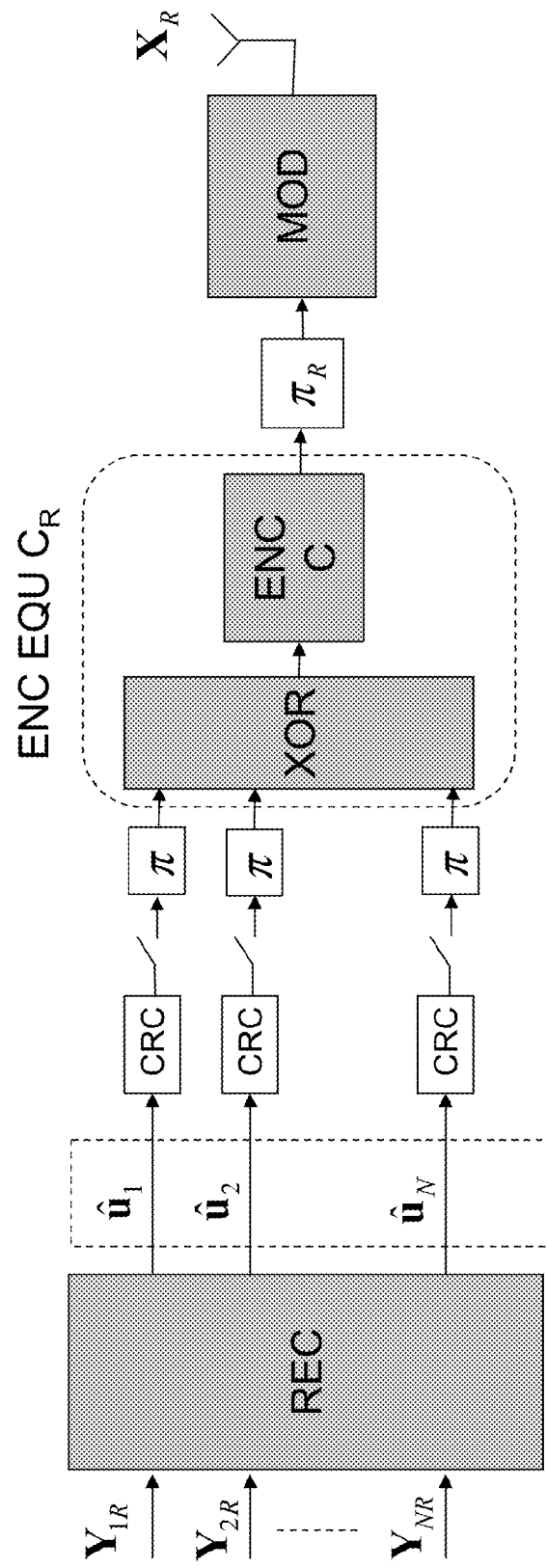
FIG. 4e shows an equivalent model of the processing of the relay for the XOR and BICM case.

The processing of the relay considered below is shown in FIG. 4e.

Given that N=2, the control message or signal gives the destination one value out of four possible values:
- value 0: only the message from source 1 was detected without error;
- value 1: only the message from source 2 was detected without error;
- value 2: both messages from both sources were detected without error; and
- value 3: both messages were detected with error.

In this particular case, the control message requires two bits to be transmitted.

In the general case, $2^N$ values are possible, thus requiring N bits to be transmitted. It should be observed that when all of the messages are detected without error, the control message need not necessarily be transmitted. The destination can determine whether or not the relay transmits merely by analyzing the received signal power.

The coding schemes corresponding to the two sources associate with any message vector $u_1 \in F_2^K$ and $u_2 \in F_2^K$ code bits $c_1 \in F_2^{n_1}$ and $c_2 \in F_2^{n_2}$ in application of $C_i: F_2^K \rightarrow F_2^{n_i}$ ($n_1$ and $n_2$: lengths of the coded bits) that are to be interleaved by $\pi_1$ and $\pi_2$ to give $V_1 \in F_2^{N_1 \times q_1}$ and $V_2 \in F_2^{N_2 \times q_2}$, and modulated (using the modulation schemes of the two sources) into symbols (code words) $x_1 \in \chi_1^{N_1}$ and $x_2 \in \chi_2^{N_2}$ belonging to a complex constellation. It is assumed that the labeling used is $\phi_1: F_2^{q_1} \rightarrow \chi_1 \subseteq C$ and $\phi_2: F_2^{q_2} \rightarrow \chi_2 \subseteq C$ where each modulated symbol of $S_1$ and $S_2$ belongs respectively to the complex sets $\chi_1$ and $\chi_2$ of cardinalities $|\chi_1|=2^{q_1}$ and $|\chi_2|=2^{q_2}$. Thus, $v_{i,k,l} = \phi_{i,l}^{-1}(x_{i,k})$ denotes the $l^{th}$ bit of the binary labeling of $x_{i,k}$ ($k=1, \ldots, N_i$, $l=1, \ldots, q_i$ for $i \in \{1,2\}$).

At the relay, the (above-defined) coding $C_R$ is applied to the vector $u'_c$ corresponding to the concatenation of messages detected without error and interleaved by $\pi$. The code bit vector that is produced is written as stated above by the vector $c_R \in F_2^{n_R}$. The vector $c_R$ is then interleaved by an interleaver $\pi_R$ to give the coded and interleaved bits $V_R \in F_2^{N_R \times q_R}$, and bit to symbol coding $\phi_R: F_2^{q_R} \rightarrow \chi_R \subseteq C$ where $\chi_R$ designates the constellation of symbols obtained with cardinality $|\chi_R|=2^{q_R}$. The signal (code word) sent by the relay is written $x_R \in \chi^{N_R}$.

As mentioned above, there are interleavers that are pseudo-random at bit level prior to transmission of all of the signals, and de-interleavers corresponding to the respective receivers. These interleavers are used for breaking the correlation between the consecutive transmitted bits, thereby making it possible to perform joint detection/decoding iteratively.

It is assumed that these interleavers and the detection/decoding models are used at the relay and at the destination, as explained in detail below.

In order to simplify the notation, it is understood below that the system has one transmit antenna and one receive antenna with Rayleigh fading that is quasi-static, and that the receivers have perfect knowledge of the noise variance and of the fading coefficients.

Figure 5:
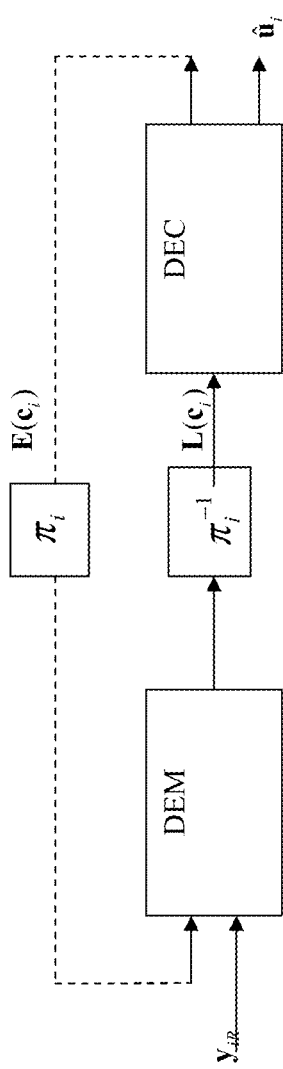
FIG. 5 shows a detection/decoding scheme at the relay.

The detection/decoding scheme applied to the relays is shown in FIG. 5.

The relay observes the signals from the two sources:

$$y_{iR,k} = h_{iR}x_{i,k} + n_{iR,k} \quad k=1, \ldots, N_i \, i \in \{1,2\} \quad (1)$$

where $n_{iR,k}$ designates the additive noise with distribution $CN(0,\sigma_n^2)$, and $h_{iR}$ designates the fading coefficient between the source i and the relay.

In order to extract the information from each source, demodulators are used that work with the decoders that correspond to the two sources, with this being done iteratively so as to make the best use of the available information.

On each iteration, the decoders accept intrinsic log likelihood ratios (LLRs) of the coded bits $\{L(c_i)\}$ and they deliver extrinsic log likelihood ratios $\{E(c_i)\}$ on the coded bits $c_i$. After re-interleaving, the extrinsic log likelihood ratios $E(V_i)$ are taken to be a priori log likelihood ratios on the inputs of the demodulator.

Iterations are stopped when the message is perfectly decoded or after reaching a certain number of iterations.

Figure 6:
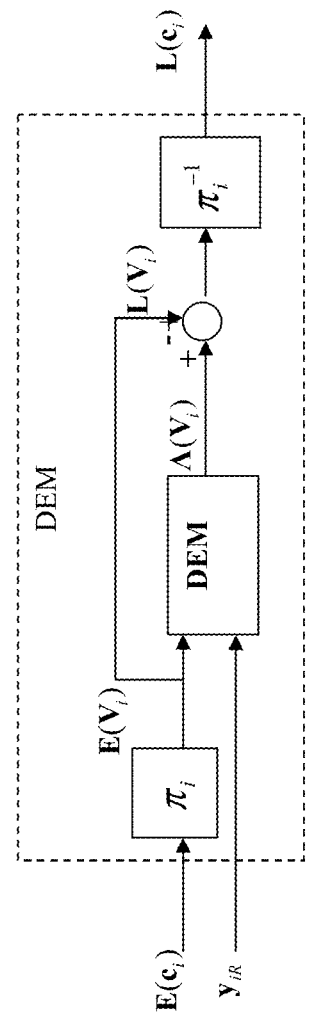
FIG. 6 is a detailed scheme of a demodulator.

FIG. 6 shows the detailed scheme for the demodulator. $\Pi_i^{-1}$ designates the de-interleaver of the channel corresponding to that used on transmission for $S_i$.

Figure 7:
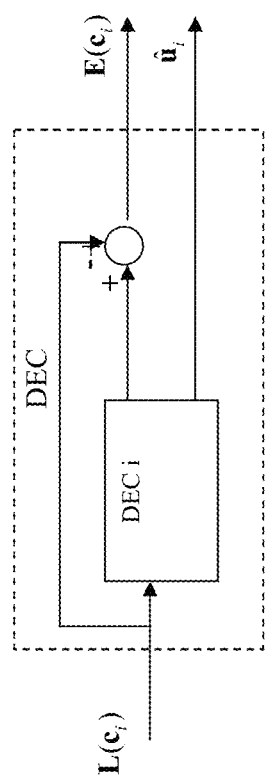
FIG. 7 is a detailed scheme of a decoder.

The detailed scheme of the decoder with the corresponding interleaver is shown in FIG. 7.

There follows an explanation of the details of a single-user detector that uses a maximum a posteriori (MAP) criterion to calculate soft information from the code bits of each source by making use of the noisy observation of the channel $y_{iR}$, and the a priori information of each bit.

The LLR on the $l^{th}$ bit of a symbol from each source $v_{i,l} = \phi_{i,l}^{-1}(x_i)$ is calculated using the following equations:

(In order to simplify the notation, the time indices are omitted.)

$$\Lambda(v_{i,l}) = \log \frac{P(v_{i,l}=1 \mid y_{iR})}{P(v_{i,l}=0 \mid y_{iR})} \quad (2)$$

$$= \log \frac{\sum_{x \in \chi_i : \varphi_{i,l}^{-1}(x)=1} p(y_{iR} \mid x_i = x) e^{p(x)}}{\sum_{x \in \chi_i : \varphi_{i,l}^{-1}(x)=0} p(y_{iR} \mid x_i = x) e^{p(x)}}$$

$$= \log \left( \frac{\sum_{x \in \chi_i : \varphi_{i,l}^{-1}(x)=1} \exp\left(-\left\|\frac{y_{iR} - h_{iR}x}{\sigma_n}\right\|^2 + p(x)\right)}{\sum_{x \in \chi_i : \varphi_{i,l}^{-1}(x)=0} \exp\left(-\left\|\frac{y_{iR} - h_{iR}x}{\sigma_n}\right\|^2 + p(x)\right)} \right)$$

Where:

$$p(x) = \sum_{l'=1}^{\log_2 |\chi_i|} \varphi_{i,l'}^{-1}(x) E(v_{i,l'}) \quad (3)$$

$(i \in \{1, 2\}$ and $l' \neq l)$

Where $\{E(v_{i,l})\}$ are a priori log likelihood ratios on the bits of each symbol supplied by the decoder.

The extrinsic log likelihood ratios at the output from the MAP detector are calculated (after de-interleaving) on the basis of:

$$L(v_{i,l}) = \Lambda(v_{i,l}) - E(v_{i,l}) \quad (4)$$

When the destination receives all three signals (from both sources and from the relay), it begins joint detection/decoding of the messages from the sources. The vectors of the signals received at the destination are written as follows:

$$y_{iD,k} = h_{iD,k}x_{i,k} + n_{iD,k} \quad k=1, \ldots, N_i, \, i \in \{1,2\}$$

$$y_{RD,k} = h_{RD,k}x_{R,k} + n_{RD,k} \quad k=1, \ldots, N_R$$

The joint decoding also depends on the control signal received from the relay (also known as "side information"):

If the control signal gives the value 0, $u_R = u_1$, i.e. the signal sent by the relay corresponds to coding C on the message from the source 1.

If the control signal gives the value 1, $u_R = u_2$, i.e. the signal sent by the relay corresponds to coding C on the message from the source 2.

If the control signal gives the value 2, $u_R = u_1 \oplus u_2$, i.e. the signal sent by the relay corresponds to the results of an XOR operation and thus to coding $C_R$, applied to the messages from both sources.

If the control signal gives the value 3 (or if no control signal is transmitted), then the relay does not transmit anything.

For each case, the detection and decoding scheme is described in detail below.

In this example, a specific coding/decoding scheme is proposed that makes it possible to perform iterative joint decoding at the destination. It is assumed that both sources use systematic codes. The decoding schemes are shown in FIGS. 8, 9, and 10, and for the different cases depending on the messages included in the XOR.

Figure 8:
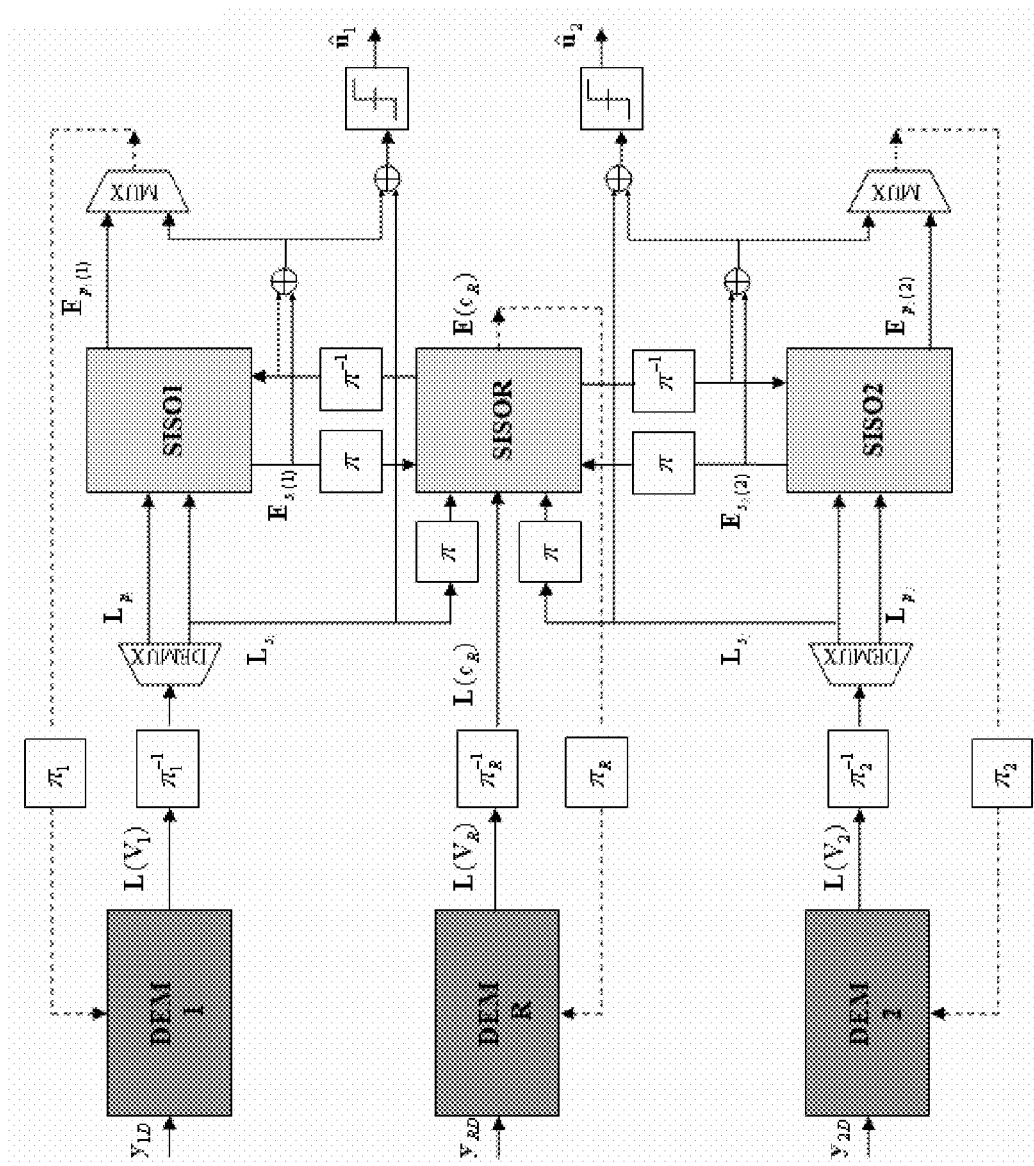
FIGS. 8, 9, and 10 are joint detection/decoding schemes at the destination.
Figure 9:
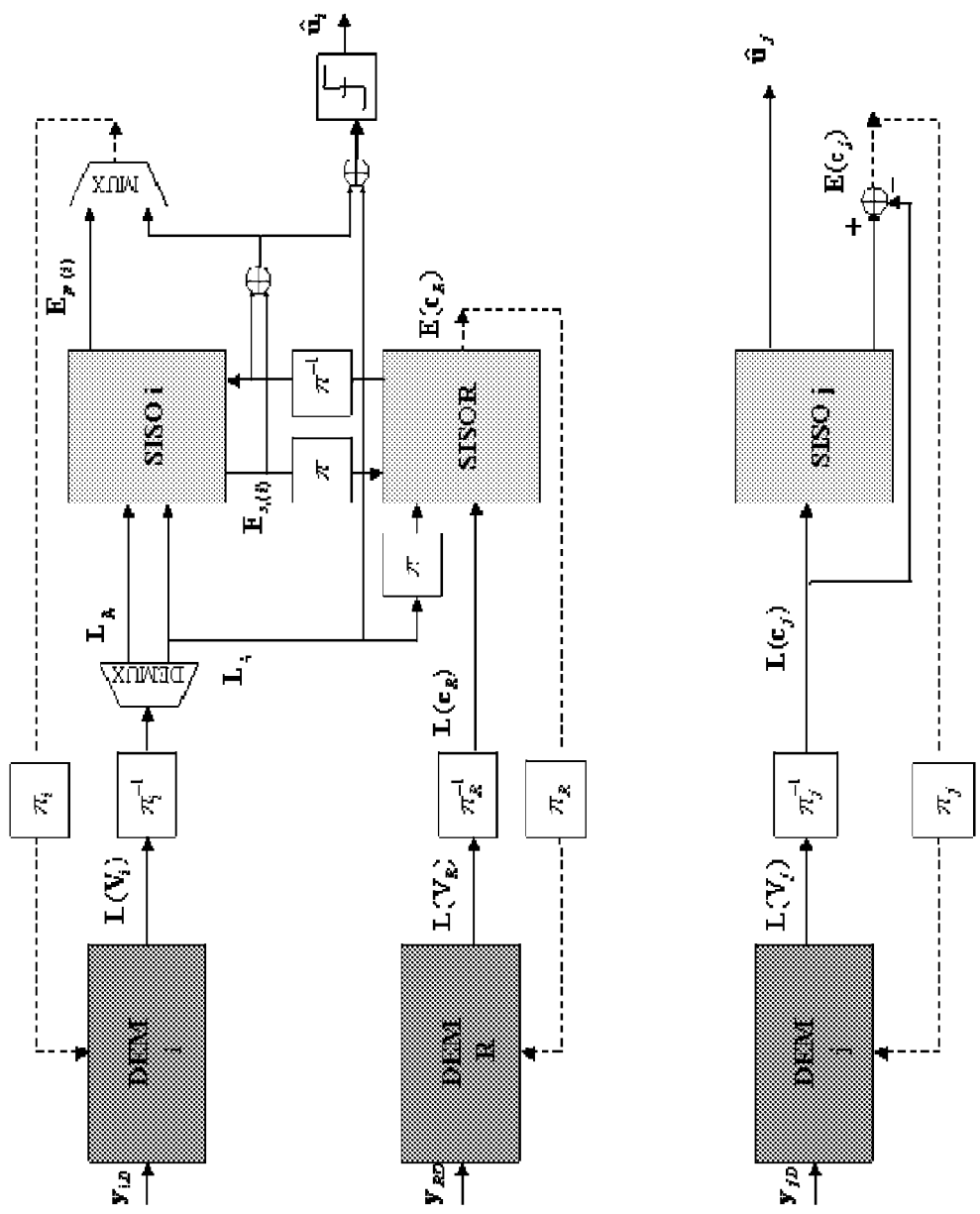
Figure 10:
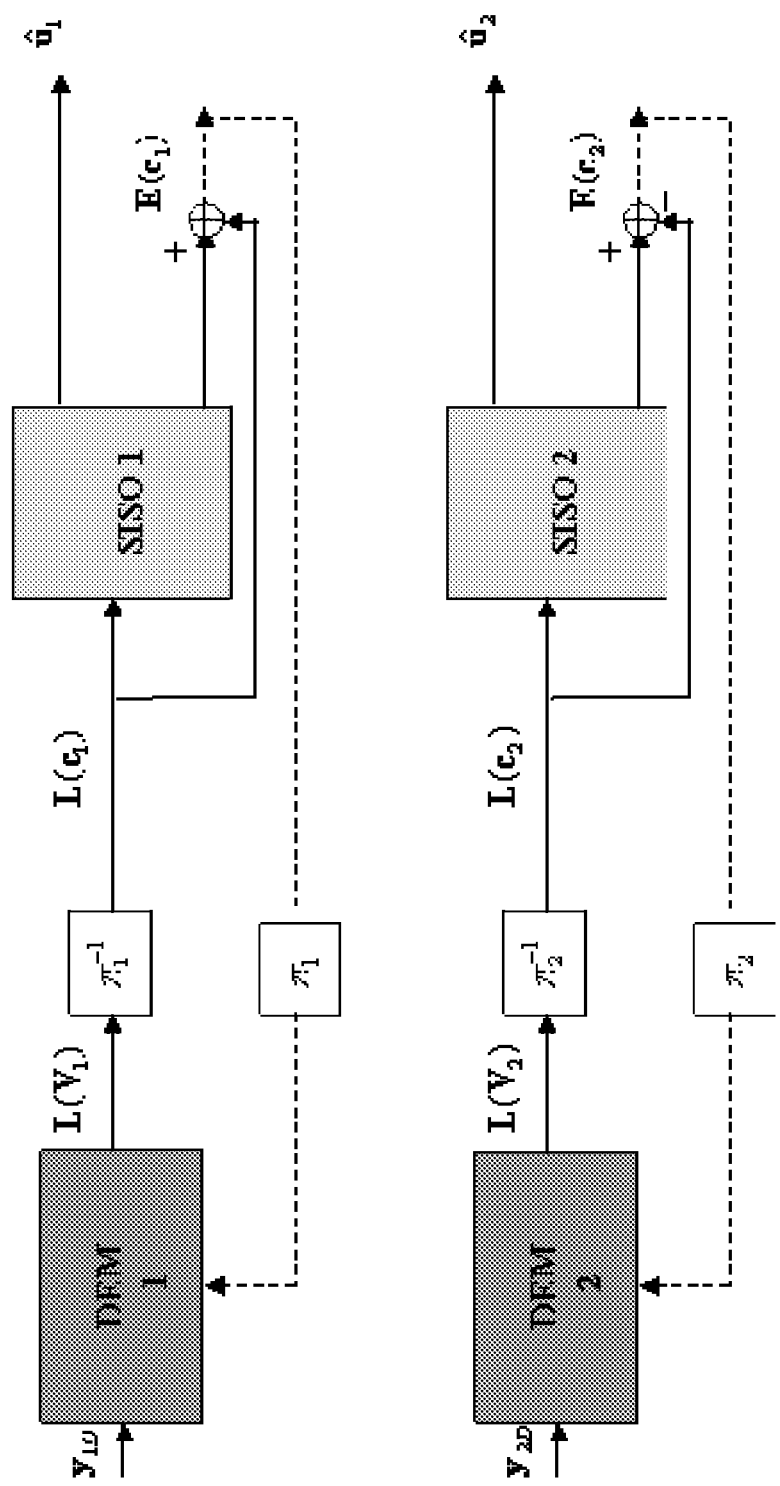

For cases in which the relay transmits, as can be seen in FIGS. 8 and 9, there are three demodulators corresponding to the three stages of transmission involved in decoding a block of information from each source.

On each iteration, the three demodulators generate the LLRs on the code bits. The operation of a demodulator is described below.

SISO decoders accept these intrinsic log likelihood ratios of the code bits $L(c_1)$, $L(c_2)$, $L(c_R)$ and they deliver extrinsic log likelihood ratios $E(c_1)$, $E(c_2)$, $E(c_R)$ on the code bits. After re-interleaving, these values are introduced as a priori information into the demodulators. The decoders SISO1, SISO2, and SISOR are based respectively on the codes $C_1$, $C_2$, and $C_R$, and SISOR accepts and produces only the LLRs corresponding to the messages from the sources included in XOR.

The details of decoding, of iterations, and of ordering depend on the control signal specifying which messages are included in the XOR, and on the CRC check at the destination. The following three cases can be distinguished.

In the first case (corresponding to the control signal having a value 2), as shown in FIG. 8, the relay sends the XOR of the two messages:

It is assumed that $L_{S_i}$ is the soft information of the systematic bits and $L_{p_i}$ is the soft information of the parity bits corresponding to the two sources (i=1,2). It is also assumed that $E_{s_i(j)}$ and $E_{p_i(j)}$ designate the extrinsic information about the systematic bits and the parity bits as generated by the decoders SISOj (j=1,2) and $E_{s_i(R)}$ is the extrinsic information about the systematic bits from the two sources as generated by the decoder SISOR.

In this context, the following process is implemented:

1. The demodulators 1, 2, and R act after re-interleaving to take the following $E_{s_1(1)} + \pi^{-1}(E_{s_1(R)})$, $E_{p_1(1)}$, $\pi^{-1}(E_{s_2(R)}) + E_{s_2(2)}$, $E_{p_2(2)}$, and $E(c_R)$ as the a priori information, and they produce the intrinsic log likelihood ratios (no a priori information on the first iteration).

2. SISO1 and SISO2 operate simultaneously:
SISO1 uses $L_{s_1}$ and $L_{p_1}$, taking $\pi^{-1}(E_{s_1(R)})$ (obtained at the preceding iteration) as the a priori information and calculates $E_{s_1(1)}$ and $E_{p_1(1)}$.
SISO2 uses $L_{s_2}$ and $L_{p_2}$, taking $\pi^{-1}(E_{s_2(R)})$ (obtained at the preceding iteration) as the a priori information and calculates $E_{s_2(2)}$ and $E_{p_2(2)}$.
3. SISOR uses $\pi(L_{s_1})$, $\pi(L_{s_2})$, and $L(c_R)$, taking $\pi(E_{s_1(1)})$ and $\pi(E_{s_2(2)})$ as the a priori information and calculates $E_{s_2(R)}$, $E(c_R)$, and $E_{s_1(R)}$.
4. Return to step 1 (taking account of new a priori values).

The above process stops as soon as both messages have been properly decoded (because of the presence of the CRC, each decoder SISO can verify whether error is present in the decoded messages) or after reaching a certain number of iterations. It should also be observed that if one of the two messages is decoded without error during a given iteration, then the soft calculation process corresponding to that message is stopped with its LLR being set at infinity. This can accelerate and simplify decoding.

At the end, hard decisions are made on the basis of:

$$\hat{u}_1 \to L_{s_1} + E_{s_1(1)} + \pi^{-1}(E_{s_1(R)})$$

$$\hat{u}_2 \to L_{s_2} + E_{s_2(2)} + \pi^{-1}(E_{s_2(R)})$$

In the second case (corresponding to the control signal having the value 0 or 1), as shown in FIG. 9, the relay sends one of the two messages that have been detected without error:

When the relay sends the symbols corresponding to $u_i$, the decoder SISOR exchanges the soft information only with the demodulator i and the decoder SISOi. The message $u_j$, $j \neq i$ is decoded in the same manner as the above-described decoding at the relay.

In the third case (corresponding to the control signal having the value 3 or to non-transmission of said signal), as shown in FIG. 10, the relay does not transmit anything.

In this case, since the destination also receives the messages directly from the sources, the decoding at the destination is like the above-described decoding at the relay. It should be observed that the destination can detect this case without receiving the in-band control message from the relay.

When using Gray symbol coding at the two sources and at the relay, the number of iterations between the demodulators and the decoders SISO is set at 1 (all of the dashed lines in FIGS. 5, 8, 9, and 10 can then be omitted). However iterations are performed between the decoders SISO that exchange extrinsic information about the systematic bits. As described above, the iterations stop as soon as both messages are properly decoded or after reaching a certain number of iterations.

The invention is described above by way of example. Other variants of the invention may be envisaged without thereby going beyond the ambit of the patent.

The invention claimed is:

1. A selective relaying method in a communications network having a plurality of sources, a relay, and a reception device, the method comprising the following acts:
receiving, by the relay, messages transmitted respectively by the sources in order to obtain estimated messages;
detecting errors in the estimated messages, by the relay;
transmitting, by the relay, a signal to the reception device, the signal being representative of only messages detected without error and resulting from a network and channel coding comprising a modulo-2 addition of the messages detected without error; and
wherein the signal is transmitted by the relay to the reception device with a control signal indicating the at least one message represented in the transmitted signal.

2. The selective relaying method according to claim 1, wherein, in the event of at least two messages being detected without error, the transmitted signal results from a network and channel coding function that depends on the number of messages detected without error and that is applied to those messages for which no error was detected.

3. The selective relaying method according to claim 1, wherein act of detecting errors is performed by using a CRC type code.

4. The selective relaying method according to claim 1, wherein the modulo-2 addition of the messages is performed together with their respective CRC codes.

5. A selective relaying device for a communications network having a plurality of sources and a reception device, the relaying device comprising:
means for receiving messages transmitted respectively by the sources to obtain estimated messages;
means for detecting errors in the estimated messages;
means for transmitting a signal to the reception device, the signal being representative of only messages detected without error and resulting from a network and channel coding comprising a modulo-2 addition of the messages detected without error; and
wherein the signal is transmitted by said relay device to the reception device with a control signal indicating the at least one message represented in the transmitted signal.

6. A communications system including at least one relaying device according to claim 5 and at least one reception device comprising:
means for receiving messages from the sources and for receiving the transmitted signal and the control signal from the relaying device;
means for jointly detecting/decoding the messages received from the sources and the received signal from the relaying device in an iterative manner and under control of the control signal received from the relaying device.

7. A method of receiving messages, the message-reception method being implemented in a reception device of a MARC system having a plurality of sources and a relay, the method comprising:
receiving messages by the reception device from the sources;
receiving a signal by the reception device from the relay, wherein the signal is representative of only messages received from the sources and detected without error by the relay and is the result of a network and channel coding comprising a modulo-2 addition of those messages detected without error;
receiving a control signal by the reception device from the relay, wherein the control signal indicates which of the messages are represented in the signal; and
applying detection/decoding by the reception device jointly to the received messages coming from the sources and to the received signal from the relay, under control of the control signal coming from the relay.

8. A reception device for a communications network having a plurality of sources and a relay, the device comprising:
means for receiving messages from the sources and for receiving a signal and a control signal from the relay, wherein the signal is representative of only messages received from the sources and detected without error by the relay and is the result of a network and channel coding comprising a modulo-2 addition of those messages detected without error, and the control signal indicates which of the messages are represented in the signal;

means for jointly detecting/decoding messages received from the sources and the received signal from the relay in an iterative manner and under control of the control signal received from the relay.

9. The reception device according to claim 8, wherein the means for jointly detecting/decoding comprise decoders with soft inputs and soft outputs.

\* \* \* \* \*